(12) United States Patent
Zheng et al.

(10) Patent No.: US 9,806,117 B2
(45) Date of Patent: Oct. 31, 2017

(54) BIASED DEEP TRENCH ISOLATION

(71) Applicant: OMNIVISION TECHNOLOGIES, INC., Santa Clara, CA (US)

(72) Inventors: Yuanwei Zheng, San Jose, CA (US); Gang Chen, San Jose, CA (US); Duli Mao, Sunnyvale, CA (US); Dyson H. Tai, San Jose, CA (US); Yi Ma, Santa Clara, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/071,035

(22) Filed: Mar. 15, 2016

(65) Prior Publication Data

US 2017/0271384 A1  Sep. 21, 2017

(51) Int. Cl.
*H01L 27/14* (2006.01)
*H01L 27/146* (2006.01)

(52) U.S. Cl.
CPC ...... *H01L 27/1463* (2013.01); *H01L 27/1464* (2013.01); *H01L 27/14621* (2013.01); *H01L 27/14623* (2013.01); *H01L 27/14627* (2013.01); *H01L 27/14636* (2013.01); *H01L 27/14645* (2013.01)

(58) Field of Classification Search
CPC ............. H01L 27/1463; H01L 27/1464; H01L 27/14623; H01L 27/14621; H01L 27/14627; H01L 27/14636; H01L 27/14689; H01L 27/0688; H01L 27/088; H01L 27/14643
USPC .......................... 257/292, 301, 432, 443, 510
See application file for complete search history.

(56) References Cited

U.S. PATENT DOCUMENTS

2014/0016012 A1* 1/2014 Oishi ..................... H04N 5/372
  348/311
2014/0291481 A1 10/2014 Zhang et al.

* cited by examiner

*Primary Examiner* — Julio J Maldonado
*Assistant Examiner* — Rodolfo Fortich
(74) *Attorney, Agent, or Firm* — Christensen O'Connor Johnson Kindness PLLC

(57) ABSTRACT

An image sensor includes a plurality of photodiodes disposed in a semiconductor material, and a through-semiconductor-via coupled to a negative voltage source. Deep trench isolation structures are disposed between individual photodiodes in the plurality of photodiodes to electrically and optically isolate the individual photodiodes. The deep trench isolation structures include a conductive material coupled to the through-semiconductor-via, and a dielectric material disposed on sidewalls of the deep trench isolation structures between the semiconductor material and the conductive material.

10 Claims, 4 Drawing Sheets

BIASED DEEP TRENCH ISOLATION

TECHNICAL FIELD

This disclosure relates generally to image sensors, and in particular but not exclusively, relates to biased deep trench isolation.

BACKGROUND INFORMATION

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices.

Pixel crosstalk currently limits performance of semiconductor image sensor devices. Ideally each pixel in an image sensor operates as an independent photon detector. In other words, electron/hole content in one pixel does not spill into neighboring pixels (or any other pixels in the device). In real image sensors, this is not the case. Electrical signals may move from one pixel to another. This crosstalk may increase the number of white pixels, reduce image sensor sensitivity, and cause color-signal mixing. Unfortunately, many solutions to crosstalk often exaggerate the effects of dark current or contribute to it. The combination of dark current and crosstalk may lead to appreciable image degradation.

Many techniques have been employed to mitigate the effects of crosstalk/dark current and enhance image sensor performance. Some of these include using heavily doped regions to isolate individual pixels and employing post-acquisition algorithms to reduce image noise. However, both of these methods still may not entirely eliminate the effects of pixel crosstalk and dark current.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1A:
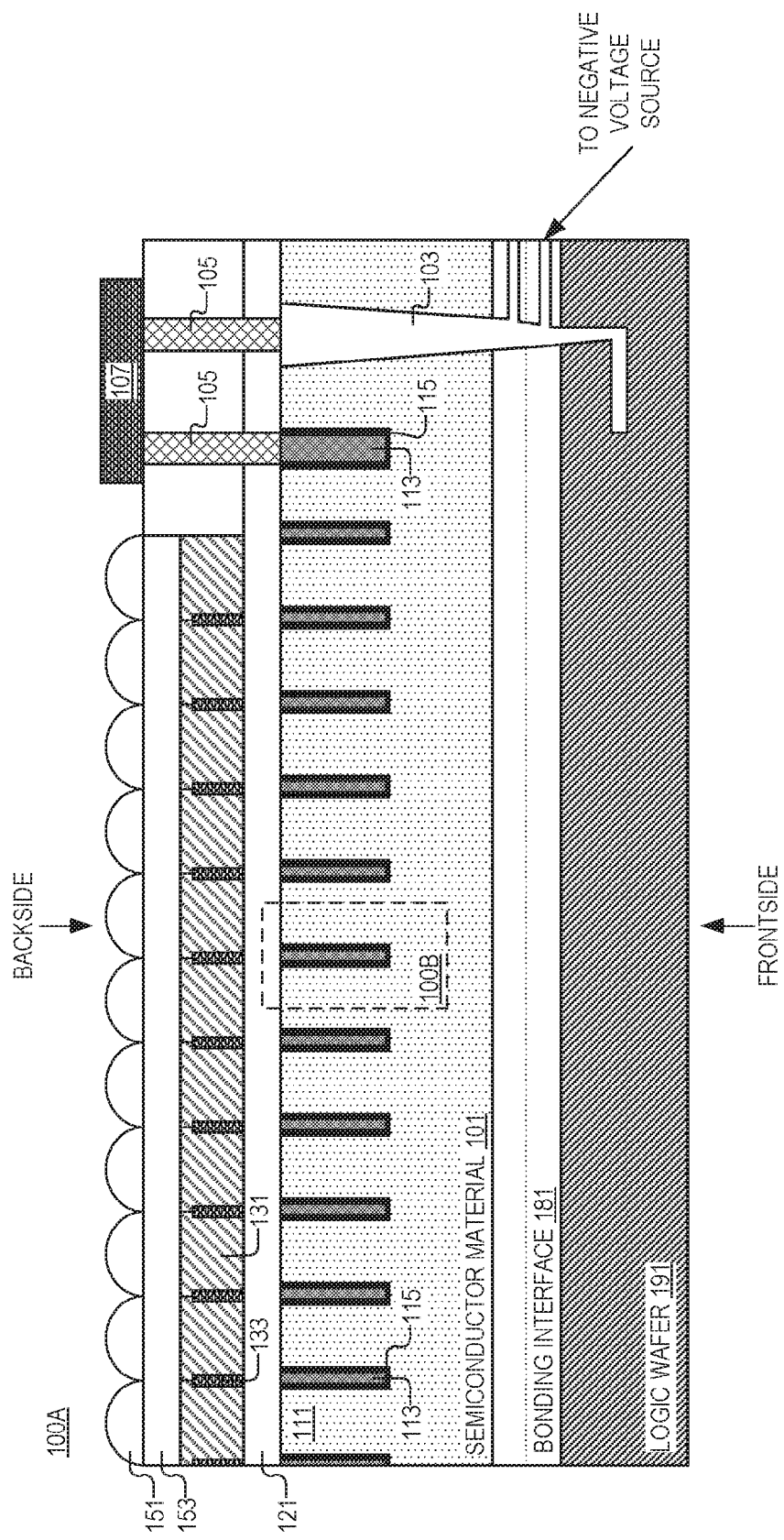
FIG. 1A is an illustration of an example image sensor, in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for biased deep trench isolation are described herein. In the following description, numerous specific details are set forth to provide a thorough understanding of the examples. One skilled in the relevant art will recognize; however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

FIG. 1A is an illustration of an example image sensor 100A. Image sensor 100A includes plurality of photodiodes 111 disposed in semiconductor material 101, and through-semiconductor-via (TSV) 103 disposed in semiconductor material 101. TSV 103 is coupled to a negative voltage source. Deep trench isolation structures are disposed between individual photodiodes 111 to electrically and optically isolate photodiodes 111. Although not depicted because FIG. 1A shows a cross-sectional view of image sensor 100A, deep trench isolation structures are interconnected in a grid-like pattern to isolate the individual photodiodes 111. The deep trench isolation structures include conductive material 113 (which, as will be shown, are coupled to through-semiconductor-via 103), and dielectric material 115 disposed on sidewalls of the deep trench isolation structures (between semiconductor material 101 and conductive material 113). In one example, dielectric material 115 includes hafnium oxide. In the depicted example, conductive material 113 induces a positive charge in semiconductor material 101 in response to a negative voltage applied from the negative voltage source. In one example, conductive material 113 includes tungsten.

As shown, image sensor 100A also includes optical shield 107 disposed on a backside of image sensor 100A along with metal interconnects 105. A first metal interconnect 105 extends from through-semiconductor-via 103 to optical shield 107, and a second metal interconnect 105 extends from optical shield 107 to conductive material 113. In one example, optical shield 107 includes aluminum, and metal interconnects 105 include tungsten and/or copper.

Also depicted is microlens layer 151 optically aligned with plurality of photodiodes 111 to direct light into plurality of photodiodes 111. Color filter array 131 is disposed between semiconductor material 101 and microlens layer 151. The color filter array 131 may include red, green, and blue color filters which may be arranged into a Bayer pattern, EXR pattern, X-trans pattern, or the like. However, in a different or the same example, the color filter array 131 may include infrared filters, ultraviolet filters, or other light filters that isolate invisible portions of the electromagnetic spectrum. It should be noted that individual color filters 131 are separated by a reflective grid 133 to help direct light to the photodiodes 111. This reflective grid 133 may be vertically aligned with the deep trench isolation structures to promote light absorption in photodiodes 111. In one or more examples, reflective grid 133 is connected to optical shield 107. In one example, reflective grid 133 and optical shield 107 may include the same material and may be fabricated at the same time.

Insulation layer 121 is disposed between semiconductor material 101 and color filter array 131. In the depicted example, insulation layer 121 also extends across the surface of semiconductor material 101 to the area where TSV 103 connects to optical shield 107. Here, metal interconnects 105 extend through insulation layer 121 to contact optical shield 107. In the depicted example, second insulation layer 153 is disposed between the color filter array 131 and microlens layer 151. Second insulation layer 153 may have the same, or different, material composition as insulation layer 121.

Logic wafer 191 (including logic circuitry) is coupled to the semiconductor material 101. The logic circuitry is coupled to plurality of photodiodes 111 to control operation of plurality of photodiodes 111. As depicted, bonding interface 181 is provided between semiconductor material 101 and logic wafer 191. Through-semiconductor-via 103 extends from semiconductor material 101 into bonding interface 181 and logic wafer 191. Although not depicted, TSV 103 may be filled with a metal or other conductive material. The metal may be disposed in the center of TSV 103 while the sides of TSV 103 are lined with oxide or other insulating material to prevent current from flowing into semiconductor material 101 from TSV 103.

In the illustrated example, image sensor 100A is a backside illuminated image sensor. However, in other examples, image sensor 100A may be a frontside illuminated image sensor. It may be appreciated by one skilled in the relevant art that circuitry (e.g., circuitry included in logic wafer 191) in a backside illuminated device is located behind the photodiodes so that the circuitry does not block image light. Conversely, in a frontside illuminated device, circuitry is disposed between the photodiodes and the incident image light.

Figure 1B:
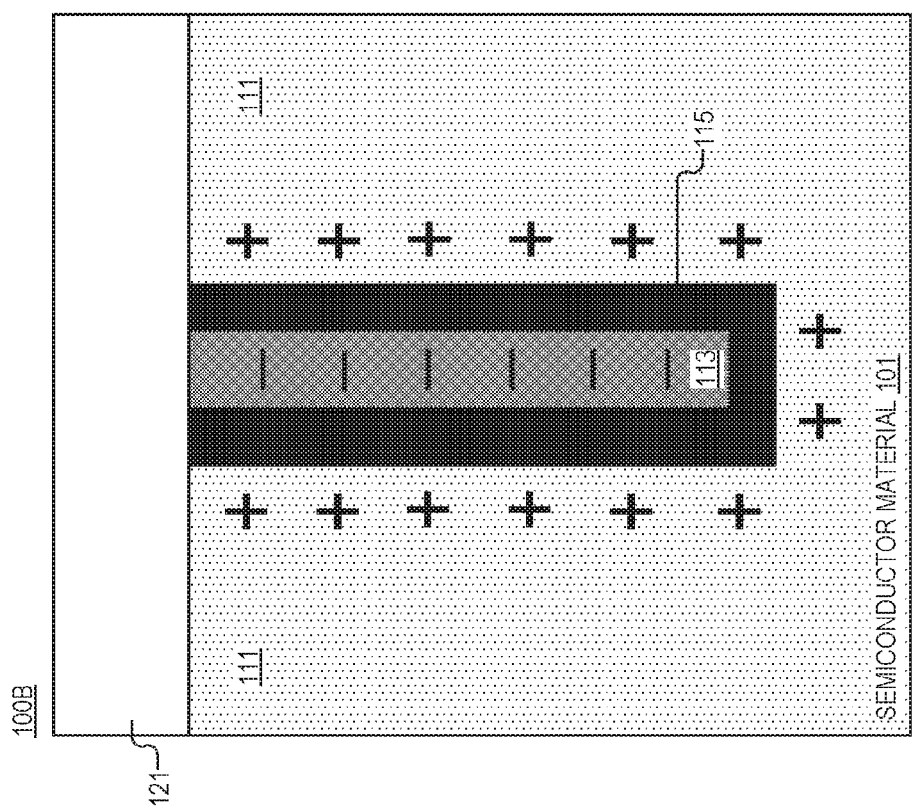
FIG. 1B is a magnified view of a deep trench isolation structure from FIG. 1A, in accordance with the teachings of the present invention.

FIG. 1B is a magnified view of a deep trench isolation structure from FIG. 1A (see 100B). Deep trench isolation structures are disposed between individual photodiodes 111 in the plurality of photodiodes 111. Deep trench isolation structures include dielectric material 115 which is disposed on the sidewalls of the deep trench isolation structures, and conductive material 113 which is disposed in the center of the deep trench isolation structures.

Deep trench isolation structures are coupled to a through-semiconductor-via (e.g., TSV 103), and both the TSV and the deep trench isolation structures are coupled to the optical shield (e.g., optical shield 107). The through-semiconductor-via is coupled to a negative voltage source, and the negative voltage source induces positive charge accumulation in the semiconductor material 101 proximate to the deep trench isolation structures. As depicted, when the negative voltage is applied to conductive material 113, positive charge builds up at the interface of semiconductor material 101 and dielectric material 115. Positive charge at the interface of dielectric material 115 and semiconductor material 101 may help to reduce crosstalk between photodiodes 111 because the interface voltage blocks charge transport between surface states in semiconductor material 101. Thus, charge from semiconductor material 101 surface states is prevented from moving between pixels on the backside of image sensor 100A. This mitigates undesirable electrical effects such as dark current and white pixels.

As previously discussed, dielectric material 115 may include hafnium oxide ($HfO_2$ or $HfO_x$); however, in other examples, dielectric material 115 may include other oxides such as: silicon oxide ($SiO_2$), silicon nitride ($Si_3N_4$), silicon oxynitirde ($SiO_xN_y$), tantalum oxide ($Ta_2O_5$), titanium oxide ($TiO_2$), zirconium oxide ($ZrO_2$), aluminum oxide ($Al_2O_3$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), yttrium oxide ($Y_2O_3$), or the like. Additionally, one skilled in the relevant art, will recognize that any stoichiometric combination of the above metals/semiconductors and their oxides/nitrides/oxynitrides may be employed in dielectric material 115, in accordance with the teachings of the present invention.

Similarly, conductive material 113 may include tungsten; however, conductive material 113 may also include metals such as: copper, gold, palladium, silver, aluminum, indium, lead, nickel, titanium, or the like. One skilled in the relevant art will recognize that any stoichiometric combination of the above metals (and other metals not listed) may be used to form conductive material 113.

Figure 2:
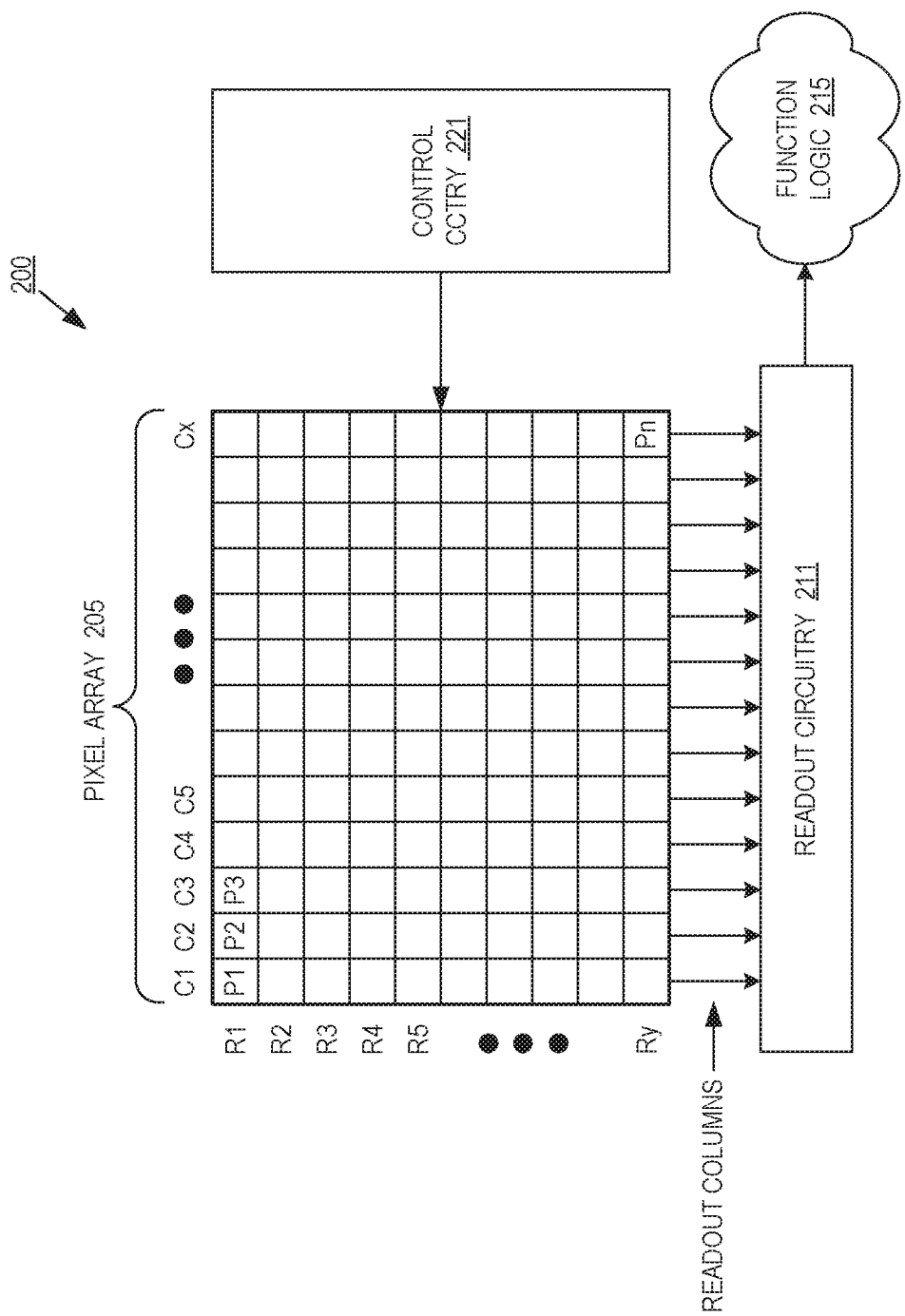
FIG. 2 illustrates one example of an imaging system including the image sensor of FIG. 1A, in accordance with the teachings of the present invention.

FIG. 2 illustrates one example of an imaging system 200 including the image sensor of FIG. 1A. Imaging system 200 includes pixel array 205, control circuitry 221, readout circuitry 211, and function logic 215. In one example, pixel array 205 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc.

In one example, after each image sensor photodiode/pixel in pixel array 205 has acquired its image data or image charge, the image data is readout by readout circuitry 211 and then transferred to function logic 215. Readout circuitry 211 may be coupled to readout image data from the plurality of photodiodes in pixel array 205. In various examples, readout circuitry 211 may include amplification circuitry, analog-to-digital (ADC) conversion circuitry, or otherwise. Function logic 215 may simply store the image data or even manipulate the image data by applying post image effects (e.g., crop, rotate, remove red eye, adjust brightness, adjust contrast, or otherwise). In one example, readout circuitry 211 may readout a row of image data at a time along readout column lines (illustrated) or may readout the image data using a variety of other techniques (not illustrated), such as a serial readout or a full parallel readout of all pixels simultaneously.

In one example, control circuitry 221 is coupled to pixel array 205 to control operational of the plurality of photodiodes in pixel array 205. For example, control circuitry 221 may generate a shutter signal for controlling image acquisition. In one example, the shutter signal is a global shutter signal for simultaneously enabling all pixels within pixel array 205 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, imaging system 200 may be included in a digital camera, cell phone, laptop computer, or the like. Additionally, imaging system 200 may be coupled to other pieces of hardware such as a processor, memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 200, extract image data from imaging system 200, or manipulate image data supplied by imaging system 200.

Figure 3:
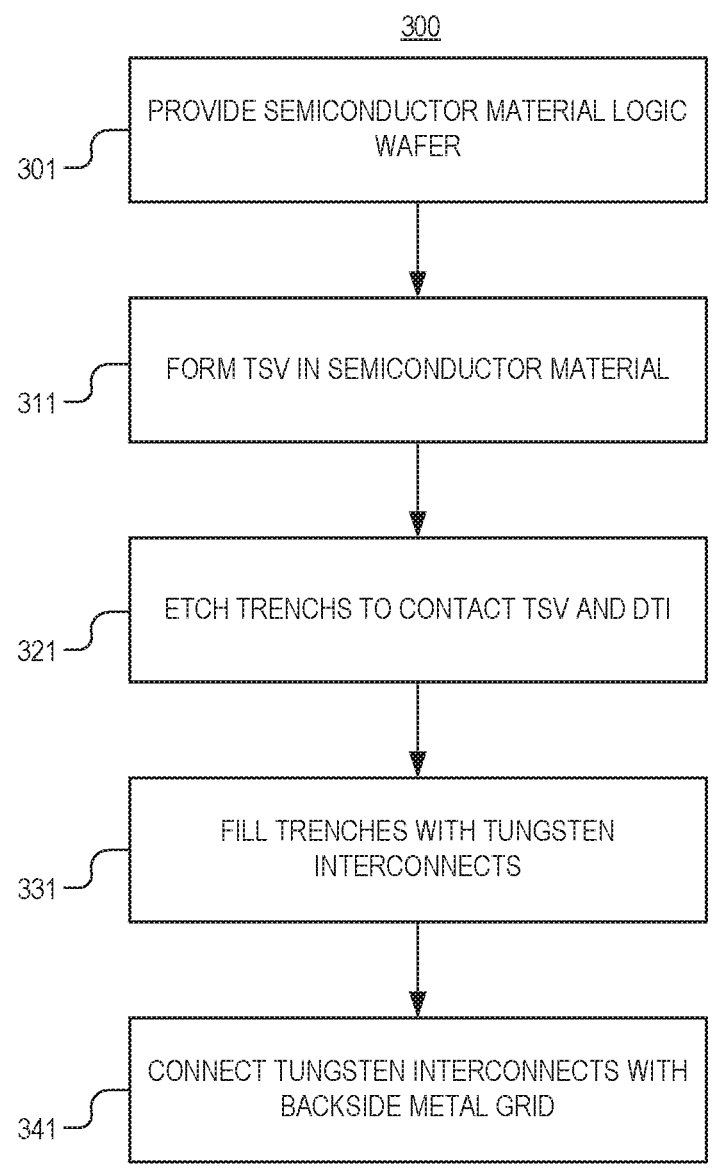
FIG. 3 is a flow chart illustrating a method of image sensor fabrication, in accordance with the teachings of the present invention.

FIG. 3 is a flow chart illustrating a method 300 of image sensor fabrication. The order in which some or all blocks appear in method 300 should not be deemed limiting. Rather, one of ordinary skill in the art having the benefit of the present disclosure will understand that some of method 300 may be executed in a variety of orders not illustrated, or even in parallel. Furthermore, method 300 may omit certain blocks in order to avoid obscuring certain aspects. Alternatively, method 300 may include additional blocks that may not be necessary in some embodiments/examples of the disclosure.

Block 301 illustrates providing the semiconductor material (e.g., semiconductor material 101) and the logic wafer (e.g., logic wafer 191). In one example these two components are bonded together by a bonding interface (e.g., bonding interface 181). In one example, both the semiconductor material and the logic wafer include silicon; however, in another example, the semiconductor material and the logic wafer may include germanium, arsenic, gallium, or the like. In the example presented here, deep trench isolation structures are already disposed in the semiconductor material. Deep trench isolation structures include a dielectric material (e.g., dielectric material 115) and a conductive material (e.g., conductive material 113), and the dielectric material is disposed between the conductive material and the semiconductor material. In one example, deep trench isolation structures may have been formed by etching trenches in the semiconductor material and then back-filling the trenches with the dielectric material followed by the conductive material.

Block 311 describes forming a through-semiconductor-via (TSV) in the semiconductor material. In one example, this involves etching a hole through the semiconductor material to contact interconnects disposed in the bonding interface and logic wafer. Etching of the hole may be achieved by a wet or dry etch depending on the geometry of the via and the desire etch rate. The hole may then be backfilled with an insulating material (like silicon oxide or the like). Another hole is then etched in the insulating material. This new hole is then backfilled with a conductive material (such as a metal or the like). The insulating material prevents electrons from flowing to the semiconductor material from the conductive material.

Block 321 depicts etching trenches to contact the TSV and the deep trench isolation structures. Prior to block 321, an insulating layer (e.g., insulation layer 121 or insulation layer 153) was deposited on portions of the device. Holes are then etched into the insulation layer to contact the TSV and the deep trench isolation structures.

Block 331 illustrates filling the trenches etched in the isolation layer with tungsten. Although here, tungsten is the choice conductive material, in other examples, many other metals and semiconductors may be used.

Block 341 describes connecting the tungsten interconnects to the backside optical shield. In one example, the optical shield is the same material as the metal grid used to separate individual color filters in a color filter array. The metal grid is disposed between individual color filters in the color filter array, and helps prevent optical crosstalk between photodiodes. Using the optical shield (which is fabricated at the same time as the metal grid, and connected to the metal grid) to connect the through-semiconductor-via to the deep trench isolation structures reduces the number of process steps otherwise required to connect these two pieces of device architecture. In the depicted example, the metal grid/optical shield may be deposited by thermal evaporation and may include aluminum to enhance its conductivity. However, in other examples, other metals of sufficient conductivity may be used to form the metal grid/optical shield.

Although not depicted, once the metal grid is formed, the color filter array may be deposited in the metal grid. Furthermore, microlenses may be formed on the color filter array. Microlens may be fabricated from a photo-active polymer that is patterned on the surface of the color filter array. Once rectangular blocks of polymer are patterned on the color filter array, the blocks may be melted (or reflowed) to form the dome-like structure characteristic of microlenses.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A system of electrical interconnection, comprising:
   a plurality of deep trench isolation structures disposed in a semiconductor material, wherein the plurality of deep trench isolation structures include a dielectric material and a conductive material, and wherein the dielectric material is disposed between the conductive material and the semiconductor material;
   a through-semiconductor-via disposed in the semiconductor material and coupled to a negative voltage source;
   an optical shield disposed proximate to a backside of the semiconductor material to block a portion of image light from reaching the semiconductor material, wherein the optical shield is coupled to the through-semiconductor-via and the plurality of deep trench isolation structures with metal interconnects.

2. The system of electrical interconnection of claim 1, wherein a first metal interconnect is disposed proximate to the backside of the semiconductor material and extends from the through-semiconductor-via to the optical shield, and wherein a second metal interconnect is disposed proximate to the backside of the semiconductor material and extends from the plurality of deep trench isolation structures to the optical shield, wherein the first metal interconnect and the second metal interconnect are included in the metal interconnects.

3. The system of electrical interconnection of claim 2, wherein at least part of the first metal interconnect and the second metal interconnect is disposed in a same lateral plane as a color filter layer, and wherein the color filter layer is disposed between a microlens layer and the semiconductor layer.

4. The system of electrical interconnection of claim 3, wherein at least part of the optical shield is disposed in a same lateral plane as the microlens layer.

5. The system of electrical interconnection of claim 1, wherein the negative voltage source applies a negative voltage to the plurality of deep trench isolation structures to induce positive charge accumulation in the semiconductor material proximate to the plurality of deep trench isolation structures.

6. The system of electrical interconnection of claim 1, wherein the conductive material includes tungsten, and the dielectric material includes hafnium oxide.

7. The system of electrical interconnection of claim 1, wherein the metal interconnects include at least one of tungsten or copper, and the optical shield includes aluminum.

8. The system of electrical interconnection of claim 1, wherein the system of electrical interconnection is included in a backside illuminated image sensor which includes a plurality of photodiodes disposed between the plurality of deep trench isolation structures.

9. The system of electrical interconnection of claim 8, further comprising:
 a logic wafer including logic circuitry, wherein the logic circuitry is coupled to the plurality of photodiodes to control operation of the plurality of photodiodes; and
 a bonding interface disposed between a frontside of the semiconductor material, opposite the backside, and the logic wafer, wherein the through-semiconductor-via extends from the semiconductor material into the bonding interface and into the logic wafer.

10. The system of electrical interconnection of claim 9, wherein the through-semiconductor-via is coupled to a negative voltage source through at least one of the bonding interface or the logic wafer, wherein the logic wafer includes a semiconductor wafer.

* * * * *